United States Patent
Stamper et al.

(10) Patent No.: US 11,271,077 B2
(45) Date of Patent: *Mar. 8, 2022

(54) TRAP-RICH LAYER IN A HIGH-RESISTIVITY SEMICONDUCTOR LAYER

(71) Applicant: GLOBALFOUNDRIES U.S. Inc., Santa Clara, CA (US)

(72) Inventors: Anthony K. Stamper, Williston, VT (US); Vibhor Jain, Essex Junction, VT (US); John J. Pekarik, Underhill, VT (US); Steven M. Shank, Jericho, VT (US); John J. Ellis-Monaghan, Grand Isle, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 3 days.

This patent is subject to a terminal disclaimer.

(21) Appl. No.: 16/807,453

(22) Filed: Mar. 3, 2020

(65) Prior Publication Data

US 2021/0280672 A1    Sep. 9, 2021

(51) Int. Cl.

| | |
|---|---|
| *H01L 27/01* | (2006.01) |
| *H01L 21/76* | (2006.01) |
| *H01L 29/06* | (2006.01) |
| *H01L 29/04* | (2006.01) |
| *H01L 21/762* | (2006.01) |
| *H01L 27/102* | (2006.01) |
| *H01L 29/737* | (2006.01) |
| *H01L 27/12* | (2006.01) |

(Continued)

(52) U.S. Cl.
CPC ........ *H01L 29/0642* (2013.01); *H01L 21/324* (2013.01); *H01L 21/762* (2013.01); *H01L 27/1022* (2013.01); *H01L 27/1203* (2013.01); *H01L 29/04* (2013.01); *H01L 29/0649* (2013.01); *H01L 29/32* (2013.01); *H01L 29/737* (2013.01)

(58) Field of Classification Search
CPC ... H01L 29/0649; H01L 29/737; H01L 29/04; H01L 27/1022; H01L 21/762; H01L 27/1203; H01L 21/324; H01L 29/32; H01L 29/0642; H01L 21/76264; H01L 29/408

See application file for complete search history.

(56) References Cited

U.S. PATENT DOCUMENTS 5,723,896 A * 3/1998 Yee .................. H01L 21/26506
257/499
8,299,527 B2   10/2012 Bol
(Continued)

*Primary Examiner* — Shouxiang Hu
(74) *Attorney, Agent, or Firm* — Thompson Hine LLP

(57) ABSTRACT

Structures including electrical isolation and methods of forming a structure including electrical isolation. A semiconductor layer is formed over a semiconductor substrate and shallow trench isolation regions are formed in the semiconductor layer. The semiconductor layer includes single-crystal semiconductor material having an electrical resistivity that is greater than or equal to 1000 ohm-cm. The shallow trench isolation regions are arranged to surround a portion of the semiconductor layer to define an active device region. A polycrystalline layer is positioned in the semiconductor layer and extends laterally beneath the active device region and the shallow trench isolation regions that surround the active device region.

20 Claims, 3 Drawing Sheets

(51) Int. Cl.
*H01L 21/324* (2006.01)
*H01L 29/32* (2006.01)

(56) References Cited

U.S. PATENT DOCUMENTS

| | | | |
|---|---|---|---|
| 9,048,284 B2 | 6/2015 | McPartlin et al. | |
| 9,129,800 B2 | 9/2015 | Allibert et al. | |
| 9,761,700 B2 | 9/2017 | McPartlin | |
| 10,192,779 B1* | 1/2019 | Shank | H01L 21/324 |
| 10,263,072 B2 | 4/2019 | McPartlin et al. | |
| 10,438,950 B2* | 10/2019 | Tasbas | H01L 21/84 |
| 2016/0161545 A1* | 6/2016 | Gambino | H01L 21/26513 |
| | | | 324/762.01 |
| 2021/0111063 A1* | 4/2021 | Shank | H01L 21/76237 |

* cited by examiner

TRAP-RICH LAYER IN A HIGH-RESISTIVITY SEMICONDUCTOR LAYER

BACKGROUND

The present invention relates to semiconductor device fabrication and integrated circuits and, more specifically, to structures including electrical isolation and methods of forming a structure including electrical isolation.

Device structures, such as radiofrequency switches, are susceptible to high capacitance and body-to-body leakage when formed using a bulk semiconductor wafer. A measure that may be taken to reduce the susceptibility is to provide the bulk semiconductor wafer with triple well isolation that surrounds an active device region containing the device structure. Another measure that may be taken to reduce the susceptibility is to replace the bulk wafer with a silicon-on-insulator wafer in which a top silicon layer furnishes an active device region and a buried insulator or buried oxide (BOX) layer is arranged between the active device region and the substrate beneath the buried insulator layer.

Although such measures have proven suitable for their intended purpose, structures with improved electrical isolation and methods of forming a structure including improved electrical isolation are needed.

SUMMARY

In an embodiment of the invention, a structure includes a semiconductor layer over a semiconductor substrate and shallow trench isolation regions in the semiconductor layer. The semiconductor layer includes single-crystal semiconductor material having an electrical resistivity that is greater than or equal to 1000 ohm-cm. The shallow trench isolation regions are arranged to surround a portion of the semiconductor layer to define an active device region. The structure further includes a polycrystalline layer in the semiconductor layer. The polycrystalline layer extends laterally beneath the active device region and the shallow trench isolation regions that surround the active device region.

In an embodiment of the invention, a method includes forming a semiconductor layer over a semiconductor substrate, forming shallow trench isolation regions in the semiconductor layer, and forming a polycrystalline layer in the semiconductor layer. The semiconductor layer includes single-crystal semiconductor material having an electrical resistivity that is greater than or equal to 1000 ohm-cm, the plurality of shallow trench isolation regions are arranged to surround a portion of the semiconductor layer to define an active device region, and the polycrystalline layer extends laterally beneath the active device region and the plurality of shallow trench isolation regions that surround the active device region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
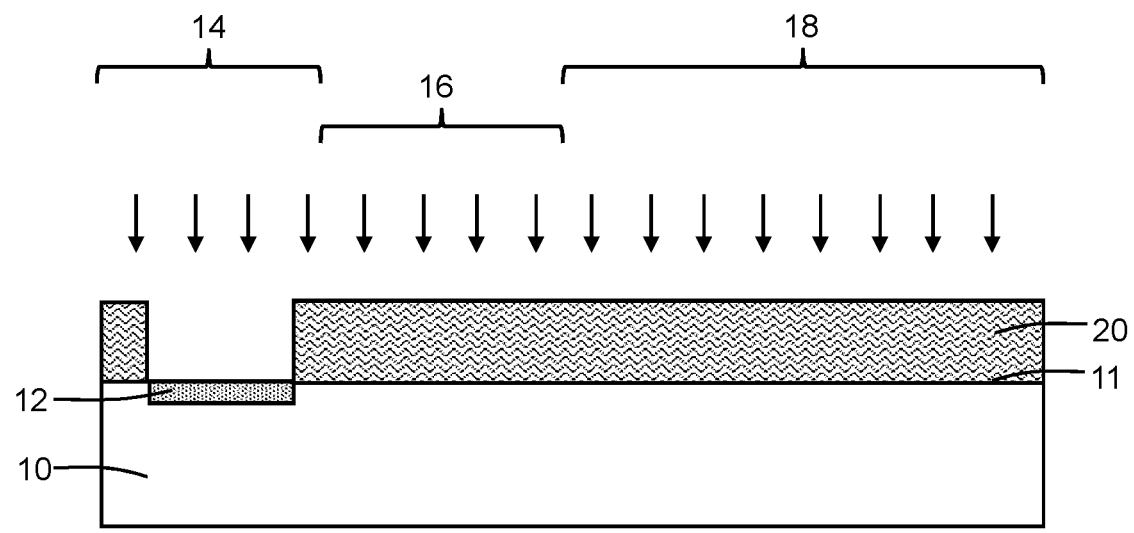
FIGS. 1-6 are cross-sectional views of a structure at successive fabrication stages of a processing method in accordance with embodiments of the invention.

With reference to FIG. 1 and in accordance with embodiments of the invention, a semiconductor substrate 10 is provided that is composed of a single-crystal semiconductor material, such as single-crystal silicon. The semiconductor substrate 10 may be a bulk wafer composed of single-crystal semiconductor material (e.g., single-crystal silicon), and the bulk wafer may be a high-resistivity bulk wafer. Generally, a high-resistivity bulk wafer may contain silicon having an electrical resistivity greater than or equal to 100 ohm-cm. In an embodiment, the high-resistivity bulk wafer may have an electrical resistivity that is greater than or equal to 1000 ohm-cm.

A doped region 12 is formed in an active device region 14 and is positioned beneath a top surface 11 of the semiconductor substrate 10. In an embodiment, the semiconductor material of the doped region 12 may be doped with an n-type dopant (e.g., phosphorus and/or arsenic) that provides n-type conductivity. The doped region 12 may be formed by, for example, ion implantation with an implantation mask 20 exposing a portion of the semiconductor substrate 10 in the active device region 14. The implantation mask 20 may include a photoresist layer applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics of the doped region 12. The implantation mask 20 may be stripped after forming the doped region 12.

The doped region 12 may be heavily doped and may provide a sub-collector for a heterojunction bipolar transistor subsequently formed in the active device region 14. A representative dopant concentration for the heavily-doped semiconductor material in the doped region 12 may be greater than or equal to $1 \times 10^{18}$ cm$^{-3}$. Additional active device regions 16, 18 are masked by the implantation mask 20 during the implantation of the active device region 14 to form the doped region 12. The doped region 12 may be heavily n-type doped to form a buried collector of a heterojunction bipolar transistor.

Figure 2:
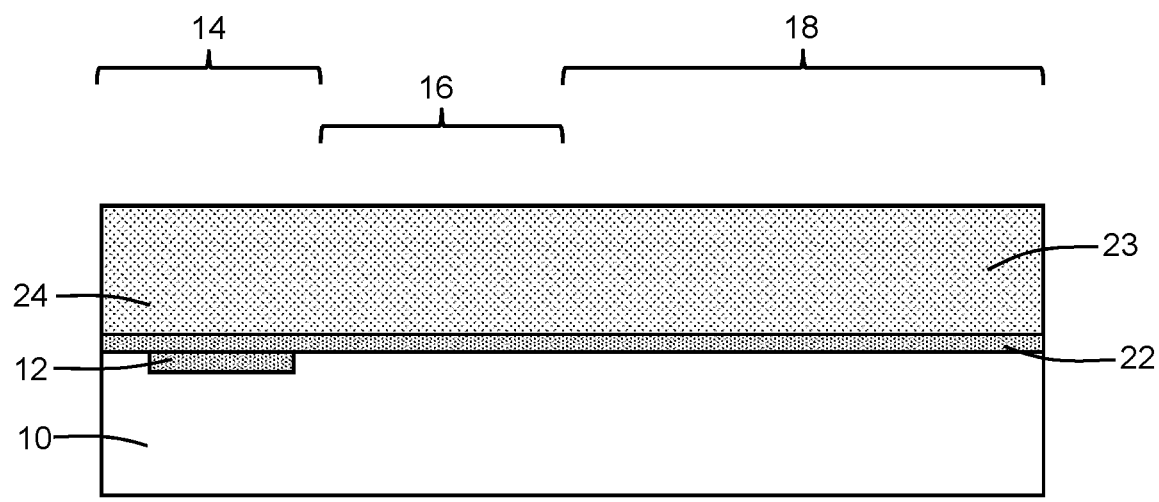

With reference to FIG. 2 in which like reference numerals refer to like features in FIG. 1 and at a subsequent fabrication stage of the processing method, a semiconductor layer 22 and a semiconductor layer 24 are formed in a layer stack over the top surface 11 of the semiconductor substrate 10 in all active device regions 14, 16, 18. The semiconductor layers 22, 24 may each include single-crystal semiconductor material in the layer stack that is epitaxially grown from the top surface 11 of the semiconductor substrate 10. The doped region 12 is located in the active device region 14 below both of the semiconductor layers 22, 24.

In an embodiment, the semiconductor material of the semiconductor layer 22 may be composed of single-crystal silicon and may be in-situ doped during epitaxial growth with a concentration of a dopant, such as an n-type dopant (e.g., arsenic or phosphorus) that provides n-type conductivity. In an embodiment, the semiconductor material of the semiconductor layer 22 may be heavily doped, and the doping of the semiconductor material of the semiconductor layer 22 may be the product of autodoping by outgassing from the chamber walls of the deposition tool used to grow the semiconductor layer 22 or from the dopant in doped region 12. In an embodiment, the semiconductor layer 22 may contain silicon having an electrical resistivity that is less than or equal to 50 ohm-cm.

In an embodiment, the semiconductor material of the semiconductor layer 24 may be composed of single-crystal silicon and may be either undoped or lightly doped during epitaxial growth with a concentration of a dopant, such as an n-type dopant (e.g., arsenic or phosphorus) that provides n-type conductivity. In an embodiment, the deposition of the semiconductor layer 24 may be performed in a different deposition tool, or in a different chamber of the same deposition tool, than the semiconductor layer 22 to avoid autodoping by outgassing. A representative dopant concentration for the lightly-doped semiconductor material in the semiconductor layer 24 may be less than or equal to $1 \times 10^{15}$ atoms-$cm^{-3}$. In an embodiment, the semiconductor layer 24 may be thicker than the semiconductor layer 22. In an embodiment, the semiconductor layer 24 may contain silicon having an electrical resistivity that is greater than or equal to 1000 ohm-cm. In an embodiment, the semiconductor layer 22 and the semiconductor layer 24 may be seamless, and the semiconductor layers 22, 24 may have similar dopant concentrations.

In an alternative embodiment, any surface layer at the top surface 11 of the semiconductor substrate 10 may be oxidized and removed by a pre-clean prior to epitaxially growing the semiconductor layer 22. In an alternative embodiment, the semiconductor layer 22 may be patterned by lithography and etching processes before epitaxially growing the semiconductor layer 24. For example, the portion of the semiconductor layer 22 in the active device region 18 may be removed before forming the semiconductor layer 24.

Figure 3:
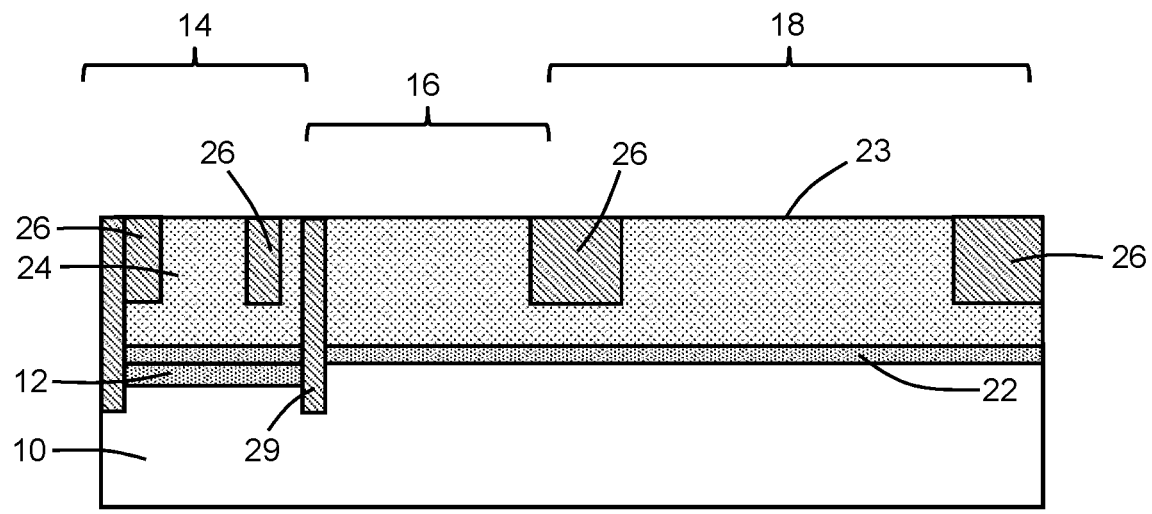

With reference to FIG. 3 in which like reference numerals refer to like features in FIG. 2 and at a subsequent fabrication stage of the processing method, shallow trench isolation regions 26 may be formed that extend partially through the semiconductor layer 24 by patterning trenches in the semiconductor layer 24, depositing a dielectric material, such as silicon dioxide, in the trenches, and planarizing with chemical-mechanical polishing. The shallow trench isolation regions 26 surround a portion of the semiconductor layer 24 in each of the active device regions 14, 16, 18. In alternative embodiments, the trenches for the shallow trench isolation regions 26 may extend through the semiconductor layer 24 into the semiconductor layer 22, or the trenches for the shallow trench isolation regions 26 may extend through both of the semiconductor layers 22, 24 and into the semiconductor substrate 10. Deep trench isolation regions 29 may also be formed that surround the active device region 14 in a similar fashion to the shallow trench isolation regions 26 except that the trenches for the deep trench isolation regions 29 are etched to a greater depth and may be filled with a combination of a thin dielectric liner and polysilicon.

Figure 4:
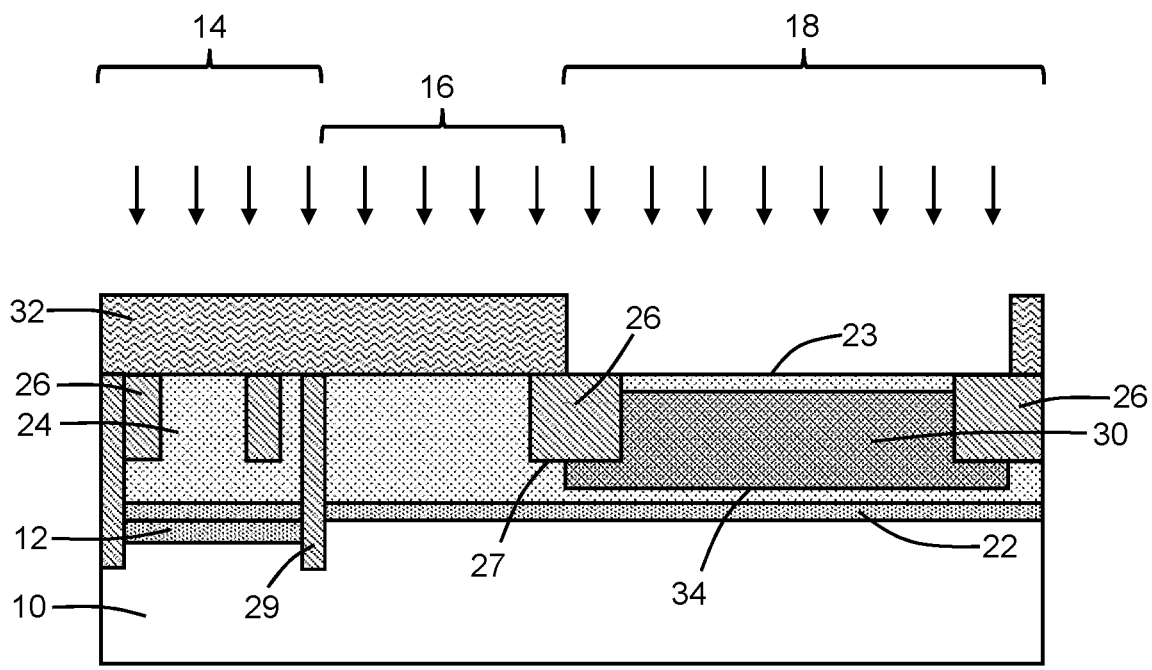

With reference to FIG. 4 in which like reference numerals refer to like features in FIG. 3 and at a subsequent fabrication stage of the processing method, a region 30 containing amorphous semiconductor material is formed by ion implantation in the semiconductor layer 24 within the active device region 18. An implantation mask 32 exposes the section of the semiconductor substrate 10 to be implanted. The implantation mask 32 may include a photoresist layer applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics of the region 30. An implantation mask 32 may be formed over the active device regions 14, 16 prior to performing the ion implantation and may be stripped after forming the region 30.

The ion implantation performed to form the region 30 introduces energetic ions, as indicated diagrammatically by the single-headed arrows, with ion trajectories that travel in paths through the semiconductor layer 24 in the active device region 18 and the dielectric material of the shallow trench isolation regions 26 surrounding the active device region 18 into the semiconductor layer 24. The energetic ions lose energy along their paths via stochastic scattering events with atomic nuclei and electrons in the traversed materials. Energy lost in nuclear collisions, which dominates at low energies, displaces target atoms of the semiconductor layer 24 from their original lattice sites, which damages the crystal lattice structure of the semiconductor layer 24 and generates point defects. The ions may eventually stop proximate to a lower boundary 34 of region 30 after their kinetic energy is fully dissipated by the energy loss. The crystal lattice structure of the semiconductor layer 24 may be damaged within the region 30 in comparison with the initial single-crystal state. Region 30 of the semiconductor layer 24 may be changed from crystalline semiconductor material (e.g., crystalline silicon) to amorphous semiconductor material (e.g., amorphous silicon) due to the use of a high dose of the implanted species.

The ions may be generated from a suitable source gas and implanted into the semiconductor layer 24 with one or more implantation conditions using an ion implantation tool. The implantation conditions (e.g., ion species, dose, energy) may be selected to tune the characteristics of the region 30. In an embodiment, the ions may be generated from argon, or from another type of noble atom gas or inert gas. In an alternative embodiment, the ions may be generated from a different source gas, such oxygen or a germanium-containing source gas (e.g., germane). The ion dose is selected to be less than a threshold ion dose beyond which recrystallization of the damaged semiconductor material in the region 30 by a subsequent anneal is not possible. In an embodiment, the ion dose may be less than or equal to $1.5 \times 10^{15}$ ions/$cm^2$. In an embodiment, the ion dose may be within a range of $1 \times 10^{14}$ ions/$cm^2$ to $1.5 \times 10^{15}$ ions/$cm^2$. In an embodiment, the dose of implanted argon may be equal to $1.25 \times 10^{15}$. The implant energy of argon, or other species, is chosen so that the lower boundary 34 of region 30 is located, relative to the top surface 23 of the semiconductor layer 24, below a lower surface 27 of the shallow trench isolation regions 26.

The single-crystal portion of the semiconductor layer 24 between the lower boundary 34 of the region 30 and the semiconductor layer 22, as well as the single-crystal semiconductor layer 22, may not be affected by the ion implantation as being located beyond the range of the implanted ions and may retain their respective single-crystal states. The lower boundary 34 of the region 30 is located above the doped region 12 in elevation and is also located above the semiconductor layer 22 in elevation. The semiconductor layer 24 may have an upper portion between the top surface 23 and the region 30 that remains single-crystal semiconductor material following implantation.

Figure 5:
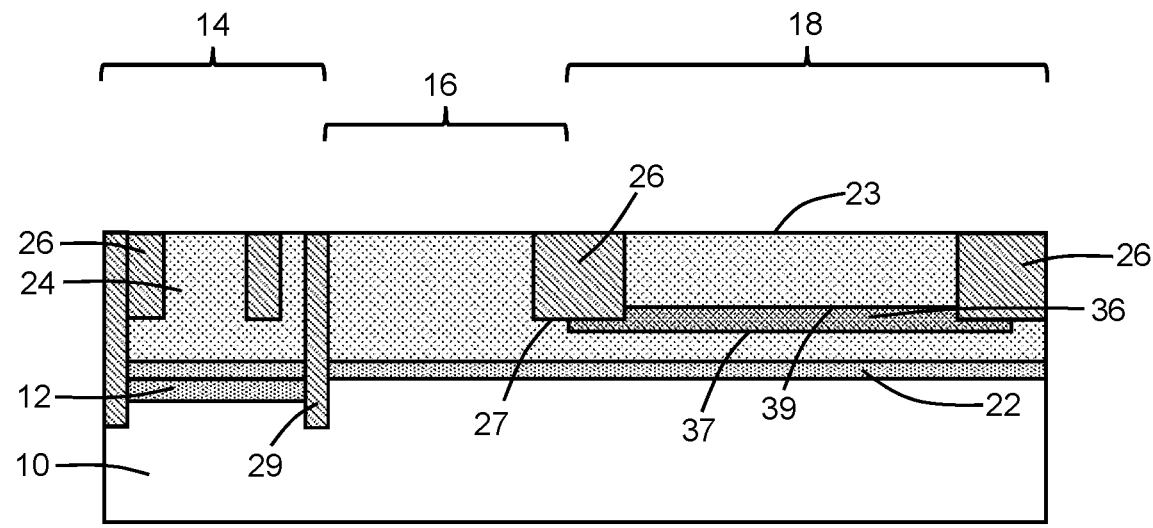

With reference to FIG. 5 in which like reference numerals refer to like features in FIG. 4 and at a subsequent fabrication stage of the processing method, the semiconductor substrate 10 is subjected to a thermal treatment (i.e., annealing process), which subjects the region 30 (FIG. 4) of the semiconductor substrate 10 to the thermal treatment. In an embodiment, the thermal treatment used to thermally treat the region 30 of the semiconductor substrate 10 may be a rapid thermal anneal. In an embodiment, the rapid thermal anneal may be performed using, for example, a bank of flash lamps that heat the semiconductor substrate 10 to a peak temperature in a range of 900° C. to 1125° C. with a dwell time at the peak temperature of 30 milliseconds to 60 seconds and, in a particular embodiment, the peak temperature may be 1000° C. that is held for a dwell time of 5 seconds.

The thermal treatment recrystallizes a portion of the damaged semiconductor material near the lower boundary 34 of the region 30 into a polycrystalline layer 36 that contains polycrystalline semiconductor material (e.g., polysilicon) and defects as residual damage in addition to the polycrystalline grains. The defects may contain trapped atoms of the implanted species (e.g., argon). The thermal treatment also recrystallizes the damaged semiconductor material between the top surface 23 of the semiconductor layer 24 and the region 30 into single-crystal semiconductor material (e.g., single-crystal silicon). The single-crystal semiconductor material of the semiconductor layer 24, which is arranged below and above the region 30, provides a crystalline template for recrystallization during the thermal treatment. The recrystallized single-crystal semiconductor material lacks grains and defects in contrast to the polycrystalline layer 36.

In the representative embodiment, the polycrystalline layer 36 may include a single layer of polycrystalline semiconductor material. In an alternative embodiment, multiple layers 36 of polycrystalline semiconductor material may result from the implantation and thermal treatment. In embodiments, the polycrystalline layer 36 may extend laterally beneath the lower surface 27 of the shallow trench isolation regions 26 surrounding the active device region 18. In embodiments, the semiconductor layer 24 may include single-crystal semiconductor material between an upper boundary 39 of the polycrystalline layer 36 and the top surface 23, and single-crystal semiconductor material between a lower boundary 37 of the polycrystalline layer 36 and the semiconductor layer 22. The polycrystalline layer 36 may be arranged substantially at or near the former location of the peak ion dose and/or peak damage in the semiconductor material of the semiconductor substrate 10.

The polycrystalline layer 36 may be characterized as a trap-rich material having an electrical resistivity that is greater than or equal to the electrical resistivity of the remainder of the semiconductor layer 24. In an embodiment, the polycrystalline layer 36 may have an electrical resistivity that is greater than or equal to 1000 ohm-cm. In an embodiment, the electrical resistivity of the polycrystalline layer 36 may be within a range of 1000 ohm-cm to 1,000,000 ohm-cm. In an embodiment, the electrical resistivity of the polycrystalline layer 36 be greater than the electrical resistivity of the portion of the semiconductor layer 24 between the polycrystalline layer 36 and the semiconductor layer 22 and also greater than the electrical resistivity of the portion of the semiconductor layer 24 between the polycrystalline layer 36 and the top surface 23 of the semiconductor layer 24. In an embodiment, the polycrystalline layer 36 may contain a dopant concentration that is less than or equal to the dopant concentration contained by the lightly-doped semiconductor material in the semiconductor layer 24.

The polycrystalline layer 36 includes a portion arranged beneath the active device region 18 and adjacent portions arranged beneath the shallow trench isolation regions 26 surrounding the active device region 18. In an embodiment, the lower surface 27 of the shallow trench isolation regions 26 may be arranged in a vertical direction between the lower and upper boundaries 37, 39 of the polycrystalline layer 36 such that the polycrystalline layer 36 overlaps in depth with the shallow trench isolation regions 26. The polycrystalline layer 36 may have a substantially uniform thickness or, alternatively, a thickness that exhibits variations with position, such as a larger thickness where overlapping with the shallow trench isolation regions 26 than directly beneath the active device region 18. The polycrystalline layer 36 is absent beneath the active device regions 14, 16. In embodiments, the shallow trench isolation regions 26 surrounds active devices in the active device region 18, and the polycrystalline layer 36 is in contact with the lower surface 27 of the shallow trench isolation regions 26 such that active devices in the active device region 18 are surrounded at and below the top surface 23 of the semiconductor layer 24 by the dielectric material of the shallow trench isolation regions 26 and the trap-rich material of the polycrystalline layer 36.

Figure 6:
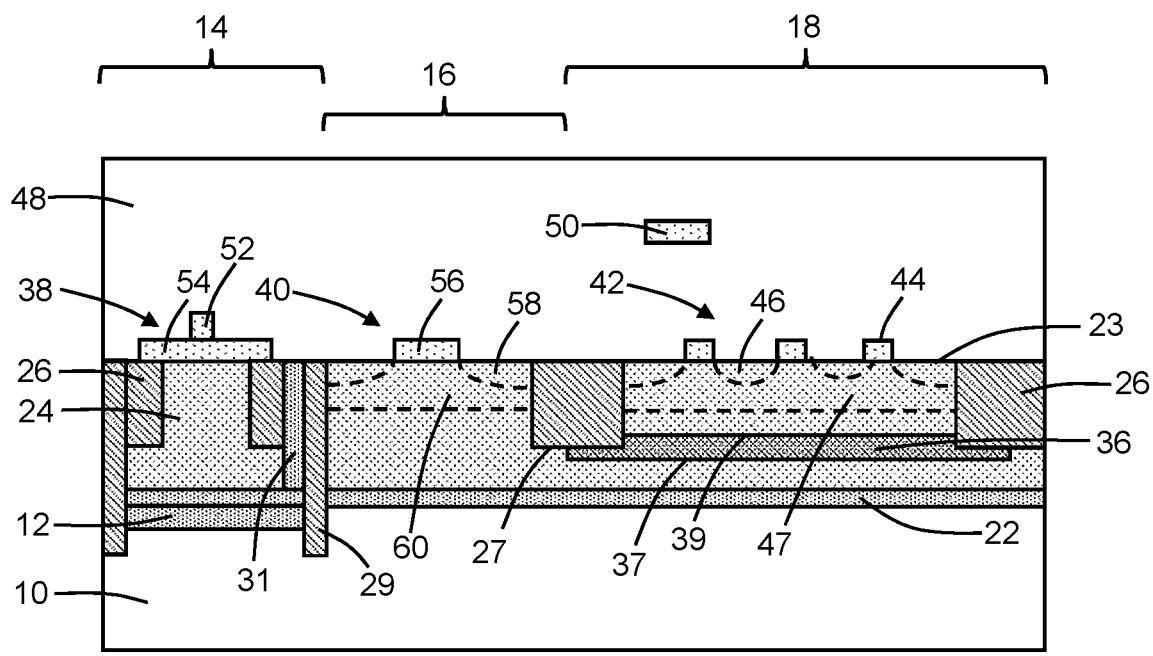

With reference to FIG. 6 in which like reference numerals refer to like features in FIG. 5 and at a subsequent fabrication stage of the processing method, a heterojunction bipolar transistor 38 may be fabricated by front-end-of-line processing as a device structure in the active device region 14 of the semiconductor substrate 10. A doped reach-through region 31 may be formed to connect the doped region 12, which may operate as a buried sub-collector layer, to the top surface 23. The heterojunction bipolar transistor 38 includes an emitter 52 and a base 54 arranged between the emitter 52 and a collector that is defined in the semiconductor layer 24. The polycrystalline layer 36 is absent in the active device region 14 beneath the heterojunction bipolar transistor 38. In alternative embodiments, a collector may replace the emitter 52 on the base 54 and the emitter may be defined in the semiconductor layer 24, or a lateral heterojunction bipolar transistor may be formed in the active device region 14.

A field-effect transistor 40 may be fabricated by front-end-of-line processing as a device structure in the active device region 16 of the semiconductor substrate 10. The field-effect transistor 40 includes a gate 56 and source/drain regions 58 in the semiconductor layer 24, and an implanted well 60 in the semiconductor layer 24. The source/drain regions 58 may include implanted halo and extension regions. The polycrystalline layer 36 is absent in the active device region 16 beneath the field-effect transistor 40.

A switch field-effect transistor 42 may be fabricated by front-end-of-line processing as a device structure in the active device region 18 of the semiconductor substrate 10. The switch field-effect transistor 42 may include a gate 44, source/drain regions 46 in the semiconductor layer 24, and an implanted well 47 in the semiconductor layer 24. The source/drain regions 46 may include implanted halo and extension regions. The polycrystalline layer 36 is present below the active device region 18 beneath the switch field-effect transistor 42. In an embodiment, the switch field-effect transistor 42 may be deployed in a radio-frequency circuit.

Middle-of-line processing and back-end-of-line processing follow, which includes formation of contacts, vias, and wiring for an interconnect structure 48 that is coupled with the heterojunction bipolar transistor 38, the field-effect transistor 40, and the switch field-effect transistor 42. In an embodiment, a passive device 50, such as an inductor, a capacitor, a resistor, or a transmission line, may be formed by back-end-of-line processing in the interconnect structure 48 over the active device region 18.

The heterojunction bipolar transistor 38 and/or the field-effect transistor 40 may be included as circuit elements in a low noise amplifier. The heterojunction bipolar transistor 38 may alternatively be included as a circuit element in a power amplifier. The various circuit elements may be combined to provide a front-end module of a radio-frequency chip that includes the switch field-effect transistor 42.

The polycrystalline layer 36, which exhibits a high electrical resistance, may improve the linearity of the switch field-effect transistor 42 during operation and, in embodiments, the linearity of the switch field-effect transistor 42 may be similar to the linearity exhibited by a switch field-effect transistor formed on a silicon-on-insulator substrate. The switch field-effect transistor 42 is formed in a portion of the semiconductor layer 24 in the active device region 18, instead of being formed in a doped well in the semiconductor substrate 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor substrate having an electrical resistivity that is greater than or equal to 1000 ohm-cm;
    a first semiconductor layer over the semiconductor substrate, the first semiconductor layer including a top surface, and the first semiconductor layer comprising single-crystal semiconductor material having an electrical resistivity that is greater than or equal to 1000 ohm-cm, and;
    a plurality of shallow trench isolation regions in the first semiconductor layer, the plurality of shallow trench isolation regions arranged to surround a first portion of the first semiconductor layer to define a first active device region;
    a second semiconductor layer positioned between the first semiconductor layer and the semiconductor substrate in the first active device region, the second semiconductor layer comprising of single-crystal semiconductor material having an electrical resistivity that is less than or equal to 50 ohm-cm; and
    a polycrystalline layer in the first semiconductor layer, the polycrystalline layer extending laterally beneath the first active device region and the plurality of shallow trench isolation regions that surround the first active device region, the polycrystalline layer having an electrical resistivity that is greater than or equal to 1000 ohm-cm, and the polycrystalline layer including an upper boundary and a lower boundary,
    wherein a first portion of the single-crystal semiconductor material of the first semiconductor layer is positioned between the upper boundary of the polycrystalline layer and the top surface of the first semiconductor layer, and a second portion of the single-crystal semiconductor material of the first semiconductor layer is positioned between the lower boundary of the polycrystalline layer and the second semiconductor layer.

2. The structure of claim 1 wherein the plurality of shallow trench isolation regions include a lower surface that is positioned between the upper boundary and the lower boundary of the polycrystalline layer.

3. The structure of claim 1 further comprising:
    a first active device in the first active device region.

4. The structure of claim 3 wherein the first active device is a switch field-effect transistor.

5. The structure of claim 3 wherein the plurality of shallow trench isolation regions are further arranged to surround a second portion of the first semiconductor layer to define a second active device region, and further comprising:
    a second active device in the second active device region.

6. The structure of claim 5 wherein the plurality of shallow trench isolation regions are further arranged to surround a third portion of the first semiconductor layer to define a third active device region, and further comprising:
    a field-effect transistor in the third active device region.

7. The structure of claim 5 wherein the first active device is a switch field-effect transistor, the second active device is a heterojunction bipolar transistor, and the second semiconductor layer is further positioned between the first semiconductor layer and the semiconductor substrate in the second active device region, and the heterojunction bipolar transistor includes a sub-collector located in the semiconductor substrate below the second semiconductor layer.

8. The structure of claim 5 wherein the polycrystalline layer is absent beneath the second active device region.

9. The structure of claim 1 further comprising:
an interconnect structure over the first active device region; and
a passive device in the interconnect structure.

10. The structure of claim 1 wherein the polycrystalline layer comprises polycrystalline grains and defects.

11. The structure of claim 10 wherein the polycrystalline layer further comprises atoms of a gas species.

12. The structure of claim 1 wherein the electrical resistivity of the polycrystalline layer is within a range of 1000 ohm-cm to 1,000,000 ohm-cm.

13. The structure of claim 1 wherein the polycrystalline layer has a substantially uniform thickness.

14. The structure of claim 1 wherein the first semiconductor layer and the second semiconductor layer comprise an n-type dopant.

15. The structure of claim 1 wherein the single-crystal semiconductor material of the first semiconductor layer has a first dopant concentration, and the single-crystal semiconductor material of the second semiconductor layer has a second dopant concentration that is greater than or equal to the first dopant concentration.

16. A method comprising:
forming a first semiconductor layer over a semiconductor substrate, wherein the semiconductor substrate has an electrical resistivity that is greater than or equal to 1000 ohm-cm, the first semiconductor layer includes a top surface and the first semiconductor layer comprises single-crystal semiconductor material having an electrical resistivity that is greater than or equal to 1000 ohm-cm;
forming a plurality of shallow trench isolation regions in the first semiconductor layer, wherein the plurality of shallow trench isolation regions are arranged to surround a first portion of the first semiconductor layer to define an active device region;
forming a second semiconductor layer, wherein the second semiconductor layer is positioned between the first semiconductor layer and the semiconductor substrate in the active device region, and the second semiconductor layer comprises single-crystal semiconductor material having an electrical resistivity that is less than or equal to 50 ohm-cm; and
forming a polycrystalline layer in the first semiconductor layer, wherein the polycrystalline layer extends laterally beneath the active device region and the plurality of shallow trench isolation regions that surround the active device region,
wherein the polycrystalline layer has an electrical resistivity that is greater than or equal to 1000 ohm-cm, the polycrystalline layer includes an upper boundary and a lower boundary, a first portion of the single-crystal semiconductor material of the first semiconductor layer is positioned between the upper boundary of the polycrystalline layer and the top surface of the first semiconductor layer, and a second portion of the single-crystal semiconductor material of the first semiconductor layer is positioned between the lower boundary of the polycrystalline layer and the second semiconductor layer.

17. The method of claim 16 wherein forming the polycrystalline layer in the first semiconductor layer comprises:
implanting ions into the first semiconductor layer to produce a band of implanted ions beneath the top surface of the first semiconductor layer and crystalline damage to the single-crystal semiconductor material of the first semiconductor layer in an implanted region between the top surface of the first semiconductor layer and the band of implanted ions; and
recrystallizing the first semiconductor layer in the implanted region and the band of implanted ions with an annealing process to produce the polycrystalline layer.

18. The method of claim 16 wherein forming the first semiconductor layer over the semiconductor substrate comprises:
epitaxially growing the first semiconductor layer,
wherein the second semiconductor layer is epitaxially grown from the semiconductor substrate in the active device region before the first semiconductor layer is epitaxially grown, and the first semiconductor layer is epitaxially grown from the first semiconductor layer.

19. The method of claim 16 further comprising:
forming an active device in the active device region.

20. The method of claim 19 wherein the active device is a switch field-effect transistor.

* * * * *

UNITED STATES PATENT AND TRADEMARK OFFICE
CERTIFICATE OF CORRECTION

PATENT NO. : 11,271,077 B2
APPLICATION NO. : 16/807453
DATED : March 8, 2022
INVENTOR(S) : Anthony K. Stamper et al.

It is certified that error appears in the above-identified patent and that said Letters Patent is hereby corrected as shown below:

In the Claims

Column 10, Claim 18, Line 40 reads:
"epitaxially grown from the first semiconductor layer."
It should read:
--epitaxially grown from the second semiconductor layer.--

Signed and Sealed this
Thirty-first Day of October, 2023

Katherine Kelly Vidal
*Director of the United States Patent and Trademark Office*